(12) United States Patent
Yen

(10) Patent No.: US 7,012,474 B2
(45) Date of Patent: Mar. 14, 2006

(54) SYSTEM AND METHOD GENERATING A DELAYED CLOCK OUTPUT

(75) Inventor: Johnson Yen, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 42 days.

(21) Appl. No.: 10/777,642

(22) Filed: Feb. 13, 2004

(65) Prior Publication Data
US 2005/0030110 A1 Feb. 10, 2005

Related U.S. Application Data

(60) Provisional application No. 60/492,985, filed on Aug. 7, 2003.

(51) Int. Cl.
*H03B 1/00* (2006.01)

(52) U.S. Cl. .............................. 331/74; 331/57; 331/45; 375/354; 327/291; 713/400; 713/500; 713/501; 713/503

(58) Field of Classification Search ................... 331/45, 331/46, 74, 57; 327/291; 375/354; 713/500, 713/501, 503, 400
See application file for complete search history.

(56) References Cited

U.S. PATENT DOCUMENTS 5,268,656 A * 12/1993 Muscavage ................... 331/45

* cited by examiner

*Primary Examiner*—Arnold Kinkead
(74) *Attorney, Agent, or Firm*—Squire, Sanders & Dempsey L.L.P.

(57) ABSTRACT

The system and method generates two clock signals, one with a 2 ns delay with respect to the other, from a single PLL to enable a RGMII.

13 Claims, 3 Drawing Sheets

SYSTEM AND METHOD GENERATING A DELAYED CLOCK OUTPUT

PRIORITY REFERENCE TO PRIOR APPLICATION

This application claims benefit of and incorporates by reference U.S. patent application Ser. No. 60/492,985, entitled "The Effective Implementation for the Egress Clock of RGMII," filed on Aug. 7, 2003, by inventor Johnson Yen.

BACKGROUND OF THE INVENTION

1. Technical Field

This invention relates generally to switches, and more particularly, but not exclusively, to a system and method for generating a delayed clock output for satisfying requirements of the Reduced Gigabit Media Independent Interface standard (RGMII).

2. Description of the Related Art

Networks, such as local area networks (i.e., LANs) and wide area networks (i.e., WANs, e.g., the Internet), enable a plurality of nodes to communicate with each other. Nodes can include computers, servers, storage devices, mobile devices, PDAs, wireless telephones, etc. Networks can include the nodes themselves, a connecting medium (wired, wireless and/or a combination of wired and wireless), and network switching systems such as routers, hubs and/or switches.

Network switching systems communicate with other nodes in a network via input/output (I/O) interfaces. A conventional I/O interface is the Gigabit Media Independent Interface (GMII) as defined by the Institute of Electrical and Electronics Engineers, Inc. (IEEE) 802.3 specification. Each GMII in a switch requires 25 pins. Accordingly, an 8-port Gigabit Switch requires 200 pins, which takes up a large amount of space.

To reduce the amount of space that the pins take up, the RGMII interface has been defined. RGMII is a reduced pin count interface that can simplify design by reducing the interface pin count from the 24 pins used in the GMII interface to 12. It can lower system cost compared to existing GMII interfaces by reducing the number of layers required to route high density networking solutions. Using RGMII, fewer pins are required for the MAC/switch Application Specific Integrated Circuit (ASIC), which can reduce the MAC/switch cost by enabling smaller die sizes than would be possible with GMII or TBI. However, the RGMII specification calls for a timing delay on both the receive signal and the transmit signal for each port.

Conventionally, to implement the timing delay, a 250 MHz phase locked loop (PLL) is communicatively coupled to a clock divide and align circuit that reduces the clock to 125 MHz and outputs a pair of clock signals, in which one of the pair has a 2 ns delay with respect to the other of the pair. However, a disadvantage of this conventional implementation is that it requires the 250 MHz PLL in addition to a 125 MHz PLL used to generate clock signals for the physical layers, thereby increasing the amount of space required within the switch.

Accordingly, a new system and method are needed that generate a 2 ns delay in a clock signal without increasing the amount of space required within a switch.

SUMMARY OF THE INVENTION

Embodiments of the invention provide a system and method for generating a 2 ns delayed clock signal without using a second PLL. Accordingly the space needed for a second PLL and associated circuitry is eliminated and the possibility of cross-coupling is substantially reduced.

In an embodiment of the invention, the method comprises: generating a first clock signal; generating a plurality of clock signals, each having different phases; generating a second clock signal based on the plurality of clock signals, the second clock signal having a different phase from the first clock signal; and outputting the first and second clock signals.

In an embodiment of the invention, the system comprises: a PLL, a plurality of clock generators, and an analog phase interpolator. The PLL generates a first clock signal. The plurality of clock generators, which are communicatively coupled to the PLL, generate a plurality of clock signals. The analog phase interpolator, which is communicatively coupled to the plurality of clock generators, generates a second clock signal based on the plurality of clock signals, the second clock signal having a different phase from the first clock signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
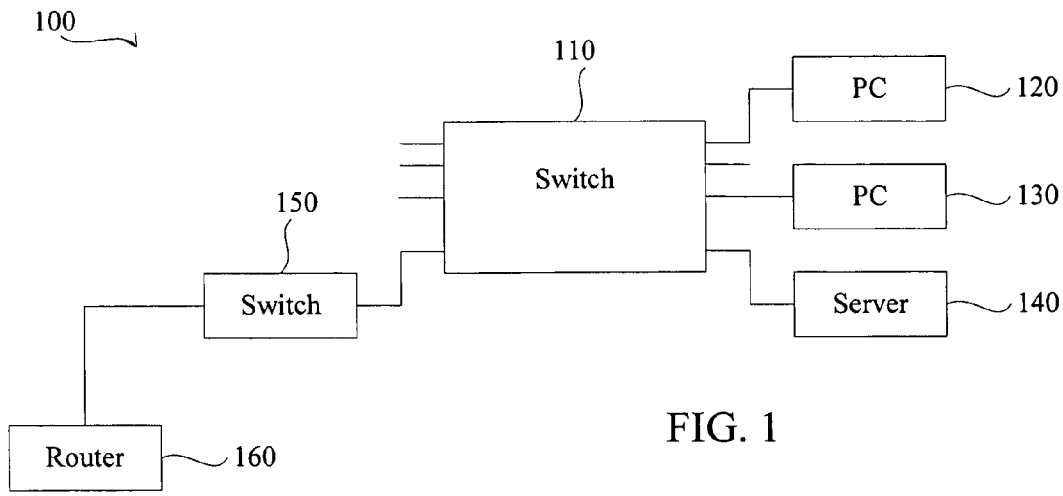
FIG. 1 is a block diagram illustrating a network system in accordance with an embodiment of the present invention.

FIG. 1 is a block diagram illustrating a network system 100 in accordance with an embodiment of the present invention. The network system 100 includes 6 nodes: PCs 120 and 130, a server 140, a switch 110, a switch 150, and a router 160. The switch 150, the PC 120 and 130, and the server 140 are each communicatively coupled, via wired or wireless techniques, to the switch 110. The router 160 is communicatively coupled, via wired or wireless techniques, to the switch 150. It will be appreciated by one of ordinary skill in the art that the network system 100 can include additional or fewer nodes and that the network system 100 is not limited to the types of nodes shown. For example, the switch 110 can be further communicatively coupled to network clusters or other networks, such as the Internet.

In an embodiment of the invention, the switch 110 includes both RGMII and non-RGMII interfaces for communicating with other network nodes. For example, the PC 120 can be communicatively coupled to the switch 110 via a RGMII of the switch 110. In contrast, the switch 150 can be communicatively coupled to the switch 110 via a non-RGMII.

During operation of the network system 100, the switch 110 receives packets from the network nodes and routes them to network nodes according to addresses in a packet header of each packet. For example, the PC 120 can transmit a unicast packet addressed to the PC 130 via the switch 110. The switch 110 will receive the packet and then read a packet header of the packet that specifies the PC 130 address. The switch 110 will then transmit the packet to the PC 130. In another embodiment, the switch 110 can route received packets to a plurality of nodes. For example, if the switch 110 receives a multicast packet, the switch 110 can transmit the packet to all network nodes specified in the packet header. If the switch 110 receives a broadcast packet, the switch 110 can transmit the packet to all network nodes.

Figure 2:
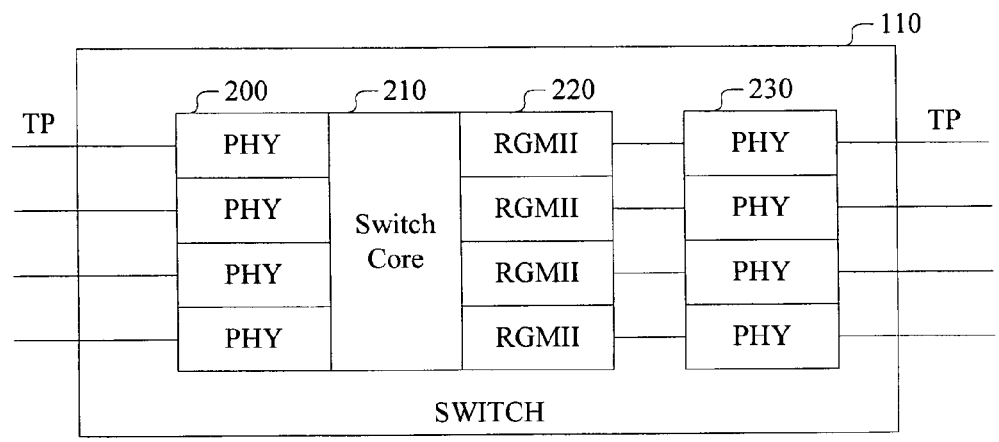
FIG. 2 is a block diagram illustrating a switch of the network system of FIG. 1.

FIG. 2 is a block diagram illustrating a switch 110 of the network system 100 (FIG. 1). The switch 110 includes a switch core 210 communicatively coupled to physical layers (PHY) 200 and RGMII 220. The PHY 200 are in turn communicatively coupled to twisted pairs or other connecting medium to network nodes of the network system 100. The RGMII 220 are communicatively coupled to PHY 230. The PHY 230 are also communicatively coupled to twisted pairs or other connecting medium to networks nodes of the network system 100.

The PHY 200 and 230 receive and transmit packets from and to network nodes, such as PCs 120 and 130, via twister pair cablings. Each PHY 200 and 230 is communicatively coupled to a single network node. Accordingly, for each PHY 200 and 230, there is a single twisted pair or other connecting medium.

The switch core 210 processes received packets by routing them to the appropriate PHY 200 and/or 230 for transmission to network nodes. As will be discussed in further detail in conjunction with FIG. 3 below, the routing includes generating and feeding two 125 MHz clock signals into each RGMII 220 (for a transmission speed of 1000 Mbps). One of the two 125 MHz clock signals must have a 2 ns delay so that data can be clocked on both the rising and falling edge of the transmit clock. This effectively doubles the transmission speed as compared to GMII. Accordingly, the number of pins in the RGMII can then be cut by half to yield the same transmission speed as GMII. In an embodiment of the invention, slower clock signals can be used for slower transmission speeds. For example, a 2.5 MHz clock signal enables a 10 Mbps transmission speed while a 25 MHz clock signal enables a 100 Mbps transmission speed.

Figure 3:
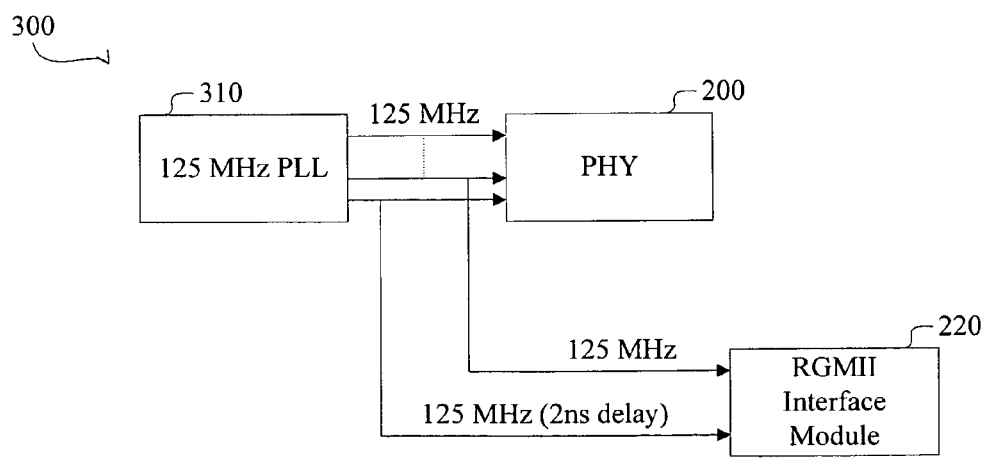
FIG. 3 is a block diagram illustrating a segment of the switch core of the switch of FIG. 2.

FIG. 3 is a block diagram illustrating a segment 300 of the switch core 210 of the switch 110 (FIG. 2). The segment 300 includes a 125 MHz PLL 310 that is communicatively coupled to the PHY 200 and RGMII 220. The PLL 310 feeds 125 MHz clock signals into the PHY 200 and the RGMII 220. For each RGMII 220, two 125 MHz clock signals are generated—one with a 2 ns delay with respect to the other.

The RGMII 220 can use both the rising edge and falling edge of the signals to clock data, thereby doubling the transmission rate as compared to GMII or other interfaces.

The main advantage of the embodiment of the invention is that only a single PLL 310 is required to generate signals for both the PHY 200 and the RGMII 220. In contrast, conventional switches required a 125 MHz PLL to generate a clock signal for the PHY 200 and a separate 250 MHz PLL to generate a clock signal for the RGMII 220. Further, the clock signal from the 250 MHz PLL needed to be divided and aligned by special clock divide and align circuitry. Accordingly, the PLL 310 enables removal of one PLL and of the clock divide and align circuit, thereby saving space in the switch core 210 and reducing costs. Further, by removing the 250 MHz PLL, any associated high-speed routing space is no longer required and the possibility of cross coupling (interference) is therefore reduced.

Figure 4:
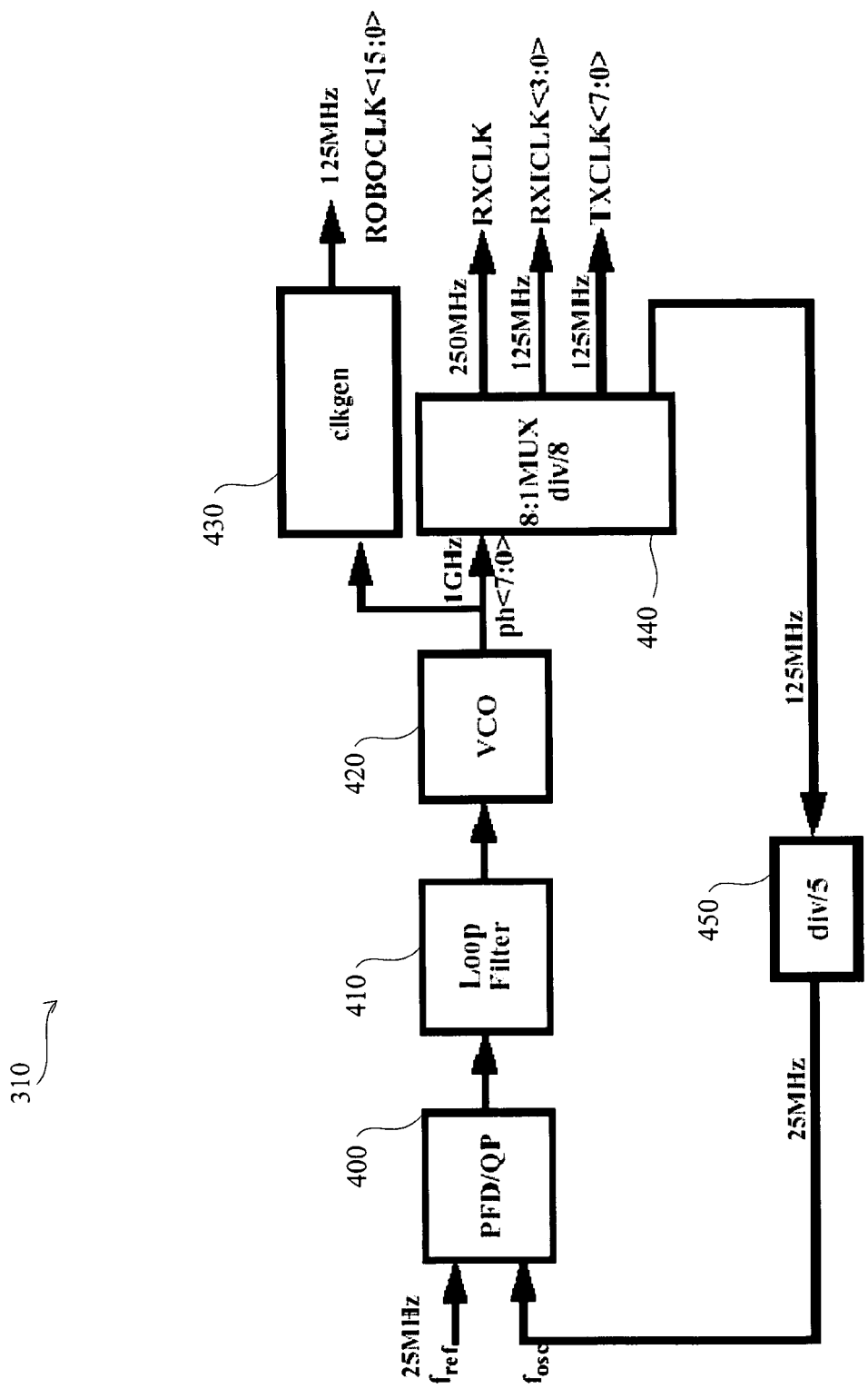
FIG. 4 is a block diagram illustrating a PLL of the switch core of FIG. 3.

FIG. 4 is a block diagram illustrating the PLL 310 of the switch core 210. The PLL 310 comprises a phase detector (PFD) 400 communicatively coupled to a loop filter 410. The loop filter 410 is communicatively coupled to a voltage controlled oscillator (VCO) 420, which is communicatively coupled to a clock generator (clkgen) 430 and a multiplexer (MUX) 440. The MUX 440 is also communicatively coupled to a div/5 circuit 450, which is communicatively coupled to the PFD 400.

The PFD 400 based on input from a 25 MHz reference clock a 25 MHz signal from the div/5 circuit 450, generates an output voltage proportional to the phase difference of the two inputs. The loop filter 410 integrates or averages the PFD 400 output. The VCO 420 then produces an AC output signal at 1 GHz that is proportional to the voltage outputted by the loop filter 410. The MUX 440 includes a div/8 circuit that divides the 1 GHz by 8 to yield two 125 MHz signals for output to an RGMII. A 125 MHz signal is also transmitted to the div/5 circuit 450 that reduces the signal to 25 MHz for input into the PFD 400. A 250 MHz signal can also be outputted.

The 1 GHz signal from the VCO 420 is also fed into the clock generator 430. As will be discussed in further detail in conjunction with FIG. 5 below, the clock generator 430 generates a plurality of 125 MHz signals that vary by phase. Accordingly, outputting different signals can provide different delays.

Figure 5:
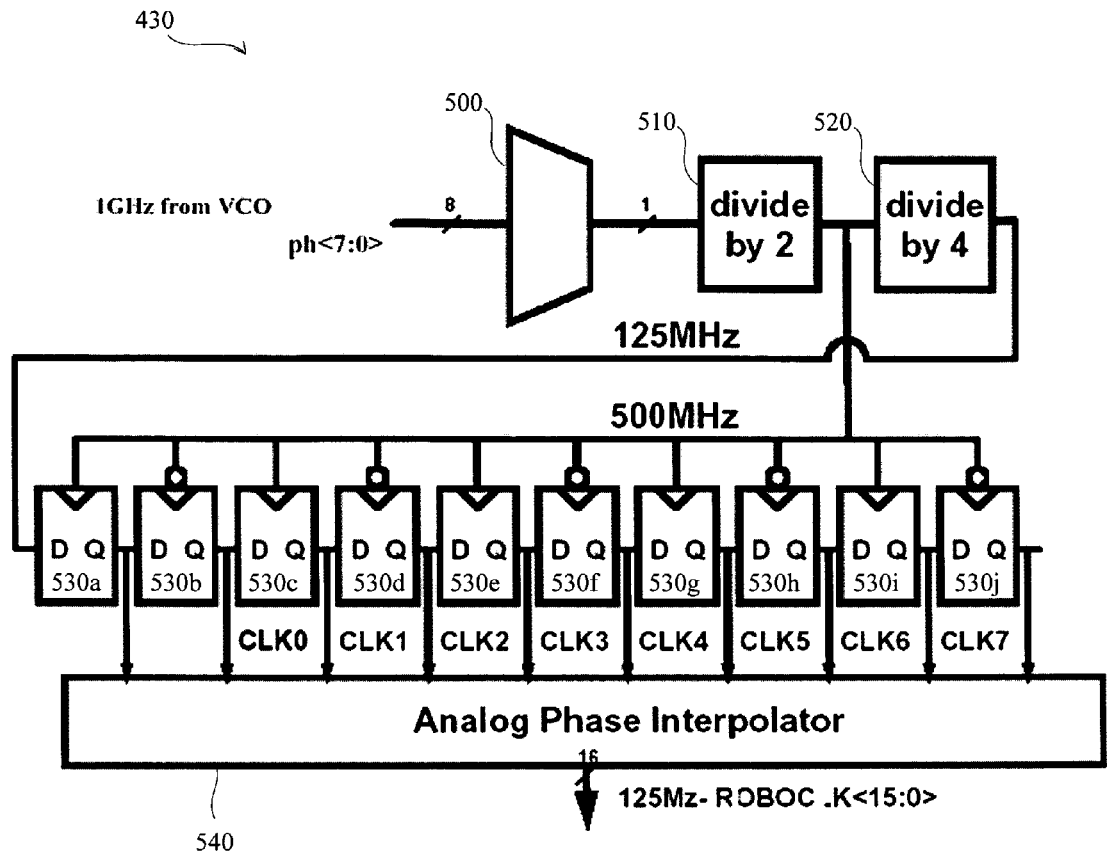
FIG. 5 is a block diagram illustrating a clock generator of the PLL of FIG. 3.

FIG. 5 is a block diagram illustrating a clock generator 430 of the PLL 310 (FIG. 3). A MUX 500 is communicatively coupled to divide by 2 circuit 510, which is in turn communicatively coupled to a divide by 4 circuit 520 and a plurality of clocks 530. The divide by 4 circuit 520 is also communicatively coupled to the plurality of clocks 530. The clocks 530 are communicatively coupled to an analog phase interpolator 540.

The MUX 500 multiplexes the incoming 1 GHz signal received from the VCO 420. The divide by 2 circuit 510 divides the multiplexed signal and feeds it into the clocks 530 and the divide by 4 circuit 520. The divide by 4 circuit 520 divides the divided signal (i.e., the signal that was previously divided by the divide by 2 signal 510) and also feeds it into the clocks 530. The clocks 530 generate signals with different phases. The analog phase interpolator 540 receives the outputs from the clocks 530 and then generates a 2 ns delayed clock signal and then outputs its to an RGMII interface.

Figure 6:
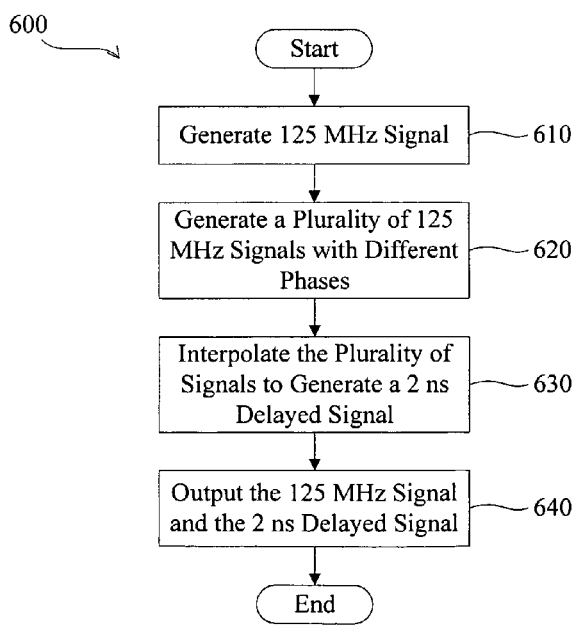
FIG. 6 is a flowchart illustrating a method of generating 2 ns time delayed signal.

FIG. 6 is a flowchart illustrating a method 500 of generating a 2 ns delay in a clock signal within a single PLL. In an embodiment of the invention, the PLL 310 performs the method 600. First, a 125 MHz signal is generated (610) from a 25 MHz signal using conventional PLL technology. After generating (610) the 125 MHz signal, a plurality of 125 MHz signals are generated (620) and fed into an analog phase interpolator, which interpolates (630) the signals to generate a 125 MHz signal with a 2 ns delay. Both signals (i.e., 125 MHz and 125 MHz with 2 ns delay) are then outputted (640) to an RGMII or other component. The method 600 then ends.

It will be appreciated by one of ordinary skill in the art that the order of the method 600 can be changed. For example, some acts of the method 600 can be performed simultaneously such as the generating (610) (620). Further, different frequency signals can be outputted depending on requirement.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   generating a first clock signal;
   generating a plurality of clock signals, each having different phases;
   generating a second clock signal based on the plurality of clock signals, the second clock signal having a different phase from the first clock signal; and
   outputting the first and second clock signals,
   wherein the generating a second clock uses phase interpolation.

2. A method, comprising:
   generating a first clock signal;
   generating a plurality of clock signals, each having different phases;
   generating a second clock signal based on the plurality of clock signals, the second clock signal having a different phase from the first clock signal; and
   outputting the first and second clock signals,
   wherein the outputting outputs the first and second clock signals to a RGMII.

3. The method of claim 2, wherein the second clock signal has about a 2 ns delay with respect to the first clock signal.

4. A method, comprising:
   generating a first clock signal;
   generating a plurality of clock signals, each having different phases;
   generating a second clock signal based on the plurality of clock signals, the second clock signal having a different phase from the first clock signal; and
   outputting the first and second clock signals,
   wherein the first and second clock signals include 125 MHz clock signals.

5. A system, comprising:
   means for generating a first clock signal;
   means for generating a plurality of clock signals, each having different phases;
   means for generating a second clock signal based on the plurality of clock signals, the second clock signal having a different phase from the first clock signal; and
   means for outputting the first and second clock signals,
   wherein the generating a second clock uses phase interpolation.

6. A system, comprising:
   a PLL capable of generating a first clock signal;
   a plurality of clock generators, communicatively coupled to the PLL, capable of generating a plurality of clock signals; and
   an analog phase interpolator, communicatively coupled to the plurality of clock generators, capable of generating a second clock signal based on the plurality of clock signals, the second clock signal having a different phase from the first clock signal.

7. The system of claim 6, wherein the generating a second clock uses phase interpolation.

8. The system of claim 6, further comprising an RGMII capable of receiving the first and second clock signals.

9. The system of claim 8, wherein the second clock signal has about a 2 ns delay with respect to the first clock signal.

10. The system of claim 6, wherein the first and second clock signals include 125 MHz clock signals.

11. The system of claim 6, wherein the plurality of clock signals is based on the first clock signal.

12. The system of claim 6, wherein the plurality of signals includes eight signals.

13. A switch comprising a system according to claim 6.

* * * * *